United States Patent [19]

Dittman et al.

[11] Patent Number: 5,742,025
[45] Date of Patent: Apr. 21, 1998

[54] LASER REFLOW SOLDERING PROCESS WITH LEAD-TIN SOLDER PADS

[75] Inventors: Eberhard Siegfried Dittman, Leger Granby, Canada; Mukund Kantilal Saraiya, Endwell, N.Y.

[73] Assignee: International Business Machines Corporation, Armonk, N.Y.

[21] Appl. No.: 794,762

[22] Filed: May 30, 1996

Related U.S. Application Data

[62] Division of Ser. No. 976,620, Nov. 16, 1992, Pat. No. 5,604,831.

[51] Int. Cl.⁶ ............................................. B23K 26/12
[52] U.S. Cl. ........................... 219/121.64; 219/121.84; 219/121.85
[58] Field of Search .................. 219/121.63, 121.64, 219/121.65, 121.66, 121.84, 121.85; 228/180.21, 180.5

[56] References Cited

U.S. PATENT DOCUMENTS

| | | | |
|---|---|---|---|
| 3,614,832 | 10/1971 | Chance et al. | 219/121.64 X |
| 4,018,373 | 4/1977 | Beerwerth et al. | 228/44.7 |
| 4,435,740 | 3/1984 | Huckabee et al. | 361/749 |
| 4,531,044 | 7/1985 | Chang | 219/121.85 |
| 4,697,061 | 9/1987 | Spaeter et al. | 219/121.64 |
| 4,894,509 | 1/1990 | Chalco et al. | 219/121.64 X |
| 5,005,939 | 4/1991 | Arvanitakis et al. | 385/53 |
| 5,152,450 | 10/1992 | Okikawa et al. | 228/180.5 |
| 5,194,710 | 3/1993 | McDaniel et al. | 219/121.63 |
| 5,227,604 | 7/1993 | Freedman | 219/121.63 |

*Primary Examiner*—Teresa J. Walberg
*Assistant Examiner*—Gregory L. Mills
*Attorney, Agent, or Firm*—Calfee, Halter & Griswold LLP

[57] ABSTRACT

An optic module contains a flexible circuit board forming a cable which connects between an optical sub-assembly and a rigid interconnect structure within the optic module. One end of the cable includes lands proximate to through holes for soldered connection to pins which extend from the optical sub-assemblies. At the other end of the cable leads extend across interconnection pads on the surface of the rigid interconnect structure for soldered connection. The top surface of the interconnect pads is 10/90 (Sn/Pb) solder to provide a high temperature soldered joint. Solder flux can not be used because cleaning solvents would contaminate the interconnect structure. An atmosphere of formic acid mixed with nitrogen surrounds the lead and pad and a fluxless solder joint is formed by laser soldering.

14 Claims, 5 Drawing Sheets

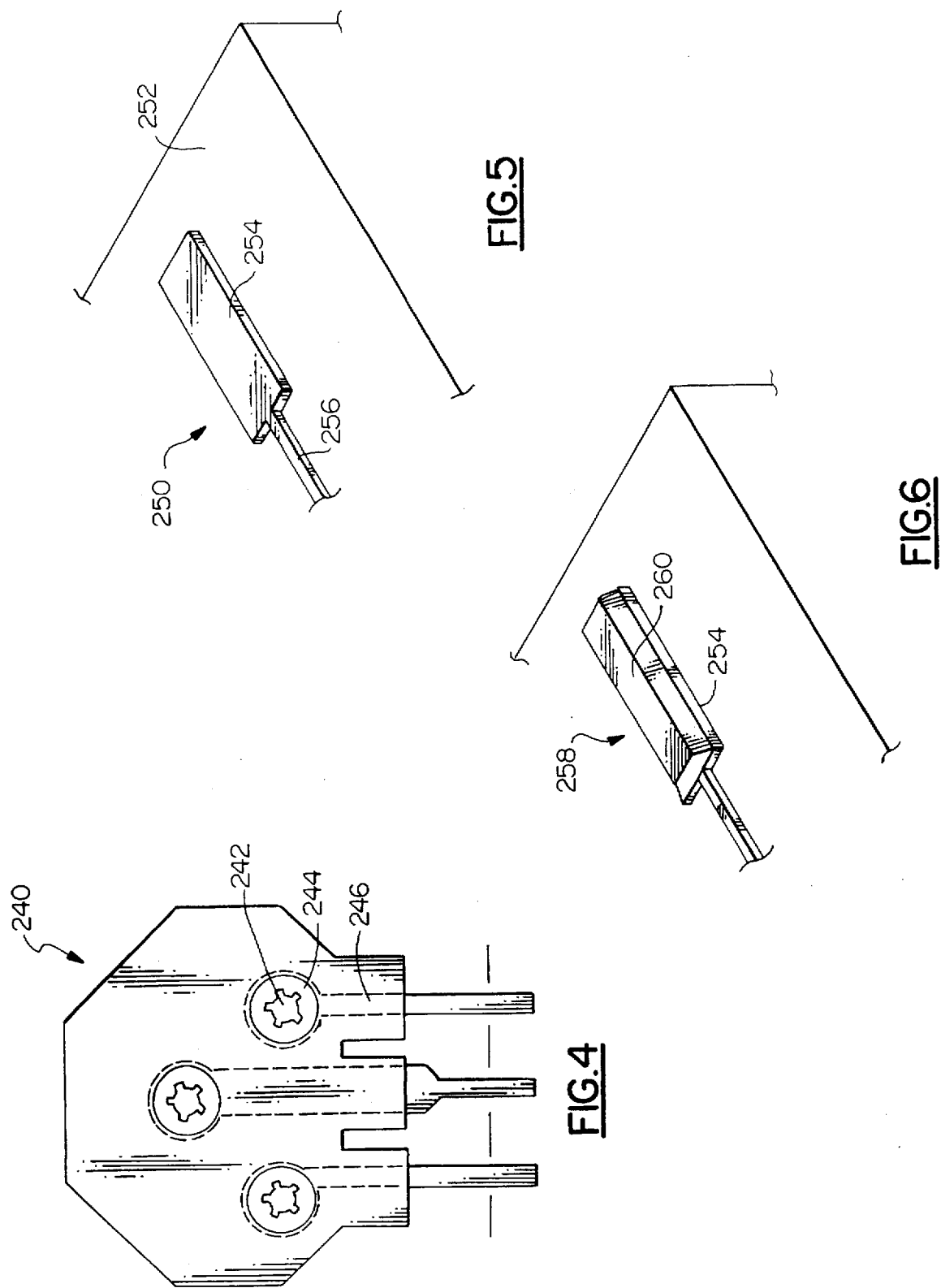

LASER REFLOW SOLDERING PROCESS WITH LEAD-TIN SOLDER PADS

This is a divisional of application Ser. No. 07/976,620 filed on Nov. 16, 1992 now U.S. Pat. No. 5,604,831.

TECHNICAL FIELD

This invention relates to optical data transmission and particularly to optical modules which are connected to optical fibers for providing such data transmissions. Even more particularly, this invention relates to interconnection of components within optical modules and to flexible circuit boards.

CROSS REFERENCE TO RELATED APPLICATIONS

This application is related to the following concurrently filed application:
U.S. Ser. No. 07/976,632 filed Nov. 16, 1992 now U.S. Pat. No. 5,295,214 issued Mar. 15, 1994 to Mukund K. Saraiya, Duane F. Card and Eberhard Dittmann, entitled: Optical Module With Tolerant Wave Soldered Joints (IBM Docket EN9-92-141), incorporated herein by reference.

BACKGROUND OF THE INVENTION

Manufacturers and those who utilize information handling systems have become interested in utilizing optical fibers for transmitting signals. Optical fibers include a round inner glass core coated with a material having a different index of refraction from that of the core. Light is transmitted along the core and reflected internally by the coating. Optical fibers may be enclosed in a protective sheath either as a single transmission line or as a bundle of fibers forming an optical cable. A single optical fiber has the potential to provide simultaneous bidirectional communication, however, as used in information systems today optical fibers are usually connected between optical sub-assemblies which either transmit or receive optical signals. Examples of various means for providing connections between optical fibers and electronic circuitry are illustrated in U.S. Pat. Nos. 4,273,413 (Bendiksen et at), 4,547,039 (Caron et at), 4,647,148 (Katagiri), 4,707,067 (Haberland et at.) and 5,005,939 (Arvanitakis et at.) which are all incorporated herein by reference.

Optical modules include a two-part housing as described in U.S. Pat. No. 5,605,939 (Arvanitakis et at.). The housing provides two receptacle sections for mounting one or more and most commonly, two barrel-shaped optical sub-assemblies. Typically, one optical sub-assembly is a light transmitter for converting an electrical signal into an optical signal and the other is a light receiver for converting the optical signal into an electrical signal. The housing provides for precise alignment of the optical sub-assemblies with optical fibers contained in a suitable plug-in connector. Also within the housing is an electrical interconnect structure, typically a ceramic substrate with a circuit of screen printed electrical conductors on the upper surface, with electronic circuits connected to the electrical circuit on the upper surface. The internal interconnect structure includes leads or pins which protrude through apertures out of the housing to connect to an external electrical interconnect structure, typically a printed circuit board, to complete the optical-electrical connection.

One end of each optical sub-assembly communicates with a respective optic cable and from the other end, conductive pins extend axially for electrical connection to an adjacent edge of the internal interconnect structure in the housing. The central axis of each barrel-shaped optical sub-assembly extends parallel to the planer internal interconnect structure. The pins extend from the adjacent ends of the optical sub-assembly substantially above the interconnect structure so the pins are bent into an elbow or S-shape for soldered or welded connection to interconnection pads on the internal interconnect structure which provides electrical connection to the electronic circuit.

The interconnection pads on the internal interconnect structure are made by producing a solder pad on top of a conductive pad of the electrical circuit on the top surface of the ceramic substrate.

Recently, in U.S. Pat. No. 5,005,939 (Arvanitakis), it was proposed as an alternative to such soldering of the optical sub-assembly pins directly to the interconnection pads of the internal interconnect structure, that a flexible interconnect structure be used to connect between the pins and the interconnection pads. That patent discloses one end of a ribbon cable soldered to the pins of an optical sub-assembly and a distal end of the cable soldered to the interconnection pads of the internal interconnect structure. That patent also disclosed that utilizing a flexible ribbon cable would reduce electromagnetic interference and that additional ESD/EMI protection could be provided by providing a multilayer ribbon cable which included a ground layer.

Materials and processes for manufacturing conventional flexible ribbon cables are well known, for example, U.S. Pat. No. 4,906,803 (Albrechta) and U.S. Pat. No. 4,435,740 (Huckabee et al.), incorporated herein by reference, describe production of a flexible cable including a conductive circuit layer which may be copper and a dielectric layer of polymer such as Kapton®. Typically a conductive metal film is coated with a positive or negative photoresist which is exposed to electromagnetic radiation using a mask and cured and otherwise processed to produce a photoresist pattern. The metal film which is not covered by the photoresist is selectively chemically etched to form the conductive circuit layer. The photoresist is then usually removed. Dielectric layers are etched using a similar chemical process or by laser etching/ablation to form windows through the dielectric layer. The dielectric is laminated onto one or both sides of the circuit layer with the windows positioned for interconnection of the cable to pins of electronic components and termination connections to pads on electrical interconnect structures.

The terminal connections to pads are formed by laying the exposed copper conductive paths or leads across conductive pads on the substrate and welding or soldering. U.S. Pat. No. 4,697,061 (Sparer et al.) describes a process in which a tin coated copper covering is ND-YAG laser welded to a tin coated copper base which is soldered to a screen printed circuit on top of a ceramic substrate. A hold-down clamp presses the dover against the base during welding. U.S. Pat. No. 4,906,812 (Nied et al.) describes a machine for laser welding, braising or soldering in an inert atmosphere. U.S. Pat. No. 4,825,034 (Auvert et al.) discusses a laser machine with movable platen and 5,048,034 (Tulip) disclose a Nd:YAG laser machine. U.S. Pat. No. 4,926,022 (Freedman) describes a laser soldering procedure in which a continuous wave-Nd:YAG laser beam is directed only at the pad while a hold-down appliance presses the lead into the pad. The patent also describes problems encounter red in attempting to heat the lead for such soldering including non co-planarity, overheating, and obscuring the lead with the hold down appliance. U.S. Pat. No. 5,021,630 (Benko et al.)

discloses utilizing clear glass for holding down the lead during laser soldering. Finally, U.S. Pat. No. 5,098,512 (Spletter) discloses a copper lead coated with tin or indium and laser soldered to a gold electrical bump with a pulsed YAG laser.

DISCLOSURE OF THIS INVENTION

It is, therefore, an object of this invention to provide a more reliable optical module.

It is another object of the invention to provide a process for assembling the optical module utilizing high speed automation.

It is also an object of this invention to connect a flexible ribbon cable to a high temperature circuit on a ceramic substrate utilizing a fluxless laser soldered joint; and more generally to provide for attaching leads to a electrical interconnect structure utilizing the fluxless laser soldered joint.

It is another object of this invention to provide an improved hold-down apparatus for laser soldered connection.

It is another object of the invention to provide an atmosphere for fluxless laser soldering.

It is another object of the invention to provide a laser for fluxless soldering of leads to a ceramic substrate.

It is another object of the invention to provide a fluxless laser soldering machine for automated production of the optical modules of the invention.

Finally, it is an object of this invention to provide a process for fluxless laser soldering of leads to solder pads on a substrate; more specifically for soldering copper leads to. 10/90 (Sn/Pb) solder pads on conductive pads on the surface of a ceramic interconncet structure without leaving any flux residue.

In the invention of applicants, optical sub-assemblies are connected to first ends of respective flexible ribbon cables. The sub-assemblies are automatically positioned in the bottom section of a two part housing with leads extending from a second end of the flexible ribbon cables positioned on 10/90 (Sn/Pb) solder pads provided on conductive pads of the thin-film electrical circuit on the top surface of a ceramic interconnect structure bonded in the bottom section. The bottom section of the housing is positioned in a laser soldering machine, and an atmosphere or cloud of inert gas mixed with formic acid for fluxless soldering. For each lead, the molybdenum surface of a probe tip is extended to press the lead against the solder pad while a CW (Continuous Wave) Nd-YAG laser heats the lead adjacent to the probe which heats the solder in contact with the lead in order to form fluxless solder joint between the lead and solder pad.

Other features and advantages of this invention will become apparent from the following detailed description of the presently preferred embodiment and alternative embodiments of the invention, taken in conjunction with the accompanying drawings.

BRIEF DESCRIPTION OF THE DRAWINGS

FIG. 4 is a plan view of a specific flexible ribbon cable embodiment of this invention for laser soldering leads to interconnection pads on a ceramic substrate;

FIG. 5 is an isometric view of a conductive pad of the thin film circuit on the top surface of a ceramic interconnect structure;

FIG. 6 is an isometric view of an interconnect pad of the invention in which a solder pad is attached on the top of the conductive pad of FIG. 4 on the ceramic interconnect structure;

DETAILED DESCRIPTION OF THE DRAWINGS

Figure 1:
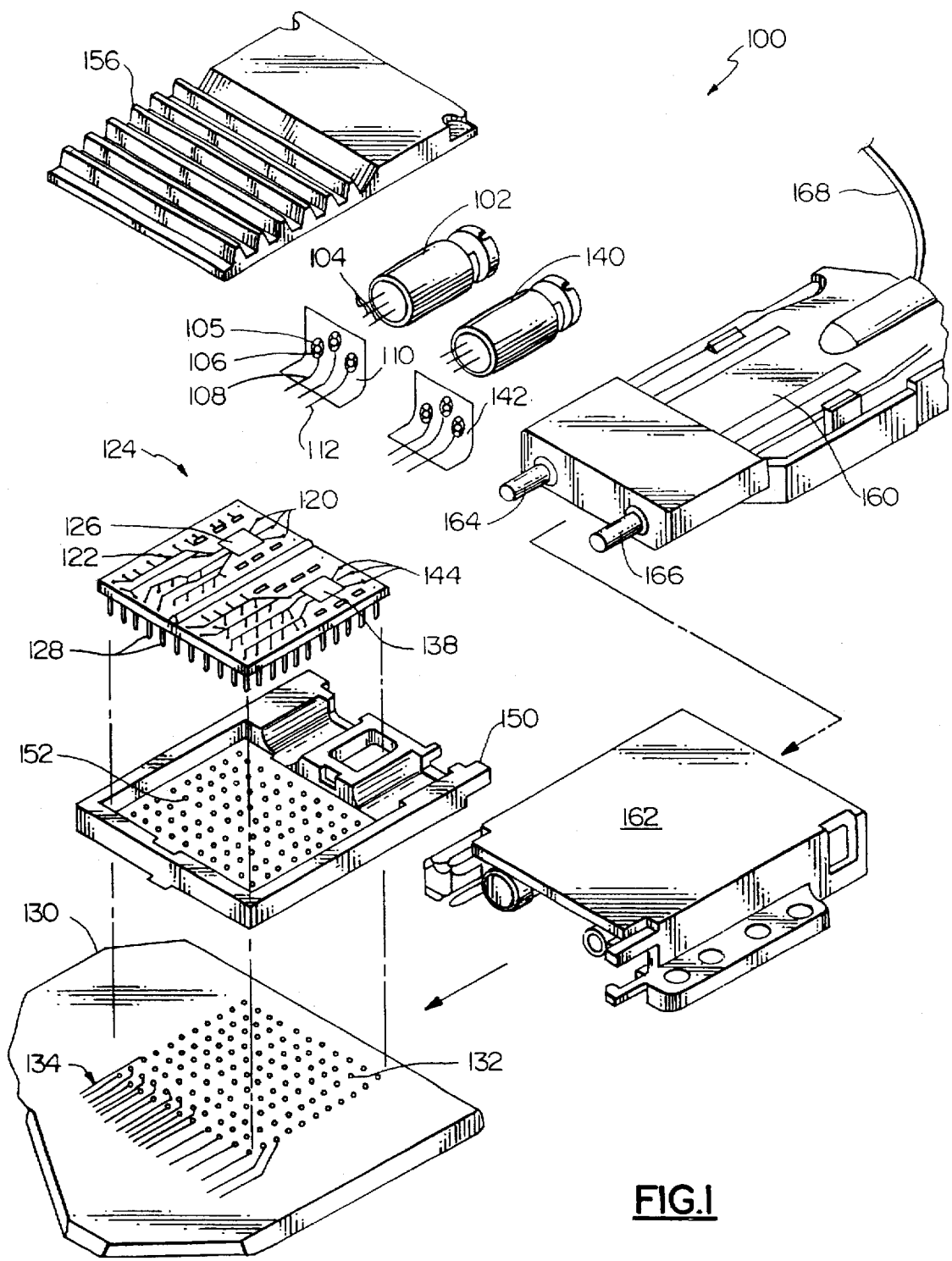
FIG. 1 is an exploded perspective view of an optical module in accordance with this invention and showing a duel optical plug connector for connection thereto.

FIG. 1 shows a specific embodiment of the optical module 100 of this invention. Longate optical sub-assembly 102 receives a first, optical signal in a port (not shown) in one longitudinal end of module 102. The module converts the first, optical signal into a first, electrical signal which is output through conductive pins 104 at the distal longitudinal end of the module. Pins 104 are soldered to flat, donut-shaped conductive, solder-wettable lands 105 encircling through holes at 106. The lands are on the surface of flexible ribbon cable 110 and are integrally connected to conductor 108 extending within dielectric layers of flexible ribbon cable 110. The connection between pins 104 and cable 110 my be made by introducing solder preforms or solder paste and reflowing or preferably by mass soldering such as immersion or most preferably by wave soldering. The flexible ribbon cable is bent 90 degrees as shown so that exposed leads 112 of conductors 108 are positioned on interconnection pads 120 of thin film screen printed electrical circuit 122 which is on the top surface of interconnect structure 124 which is preferably of rigid construction and more preferably of ceramic construction. The connection of cable 110 with pads 120 is provided by laser soldering as later described in this specification. Electronic circuit 126 processes the first, electrical signal and transmits a first processed electrical signal. Electronic circuit 126 is connected through output conduits of electrical circuit 122 which are connected to pins 128. The first, processed, electrical signal is transmitted from electronic circuit 126, through electrical circuit 122, to pins 128. When the optical sub-assembly is positioned on electrical interconnect structure 130 such as a flexible circuit board or a printed circuit board, pins 128 couple with connectors 132 of an electrical circuit 134 which extends on the exterior and/or the interior of interconnect structure 130. The first, processed, electrical signal is transmitted from the pins into interconnect structure 130.

A second, electrical signal is transmitted from external interconnect structure 130, through pins 128, through electrical circuit 122, and to electronic circuit 138 which processes the second electrical signal. In a manner similar to the connection of optical sub-assembly 102, optical sub-assembly 140 is connected through flexible ribbon cable 142 to interconnection pads 144 of electrical circuit 122 which is connected to electronic circuit 138. Thus, the second electrical signal is processed and transmitted to optical sub-assembly 140 which converts the second, processed, electrical signal into a second optical signal which is transmitted through a port (not shown) in one end of the module.

Optical modules 102 and 140 and rigid interconnect structure 124 are mounted within a housing of two part construction preferably of cast aluminum which may be machined as required. The bottom of lower part 150 of the housing includes a matrix of apertures 152 through which pins 128 of interconnect structure 124 extend to communicate with interconnect structure 130. Alternately a window (not shown) could be provided in the bottom of lower part 150 for the pins. Preferably Structure 124 is held in a fixed position in lower part 150 by adhesive, preferably epoxy. The optical sub-assemblies may also be fixed in position by an adhesive such as epoxy or may be positioned by keys to allow limited movement for adjustment to tolerances in the dimensions of plug in module 160. The top of upper part 154 of the housing includes fins 156 for cooling the optical module.

Optical plug 160 connects into guide 162 to position optical connectors 164 and 166 in relation to apertures (not shown) in one end of each optical sub-assembly 102 and 140 respectively, so that bidirectional optical communication fibers of cable between the optical fibers of cable 168 and optical module 100.

The substrate is metallized ceramic such as alumina and the circuit is produced by evaporation or sputtering and a selective subtractive lithographic process to produce a wiring layer. Preferably the metallization is 80 Å chromium, 8,000–80,000 Å copper, and finally another 80 Å chromium. The substrate may be multilayer ceramic. Alternatively, the substrate may be a metal or resin such as fiberglass. The copper pads are 50 by 60 mils and the solder layer is produced by etching to remove the chromium surface from the pads followed by plating about 40 mils of 10/90 (Sn/Pb) solder onto the pads.

Part of this invention is the discovery that when the pins of the optical sub-assemblies are bent and joined directly to the interconnection pads, there was a high rate of failure in the pins or joints over the life of the optical modules. It is also the discovery of applicants that these failures could be eliminated in the optical module of this invention by utilizing a flexible ribbon cable to connect between the pins of the optical sub-assembly and the ceramic interconnect structure.

Flux should not be utilized in making the joint between the leads and the interconnection pads because integrated circuits are connected or will be connected to the top surface of the interconnect structure. Furthermore, due to high operating temperatures normal eutectic solders should not be utilized. Also, the electronic circuits are attached using flip-chip/solder ball technology. Due to thermal mismatch between the chip and substrate, the tin content is high to provide flexibility. Preferably, the solder is 20/80 to 3/97 and most preferably approximately 10/90 (Sn/Pb). Previous techniques of fluxless laser soldering could not provide a high quality, closely spaced joint on the ceramic substrate possibly because of the high heat transfer through the ceramic material. This invention has enabled high quality 10/90 (Sn/Pb) soldered connections on a ceramic substrate to be spaced closer than 2 mm.

Figure 2:
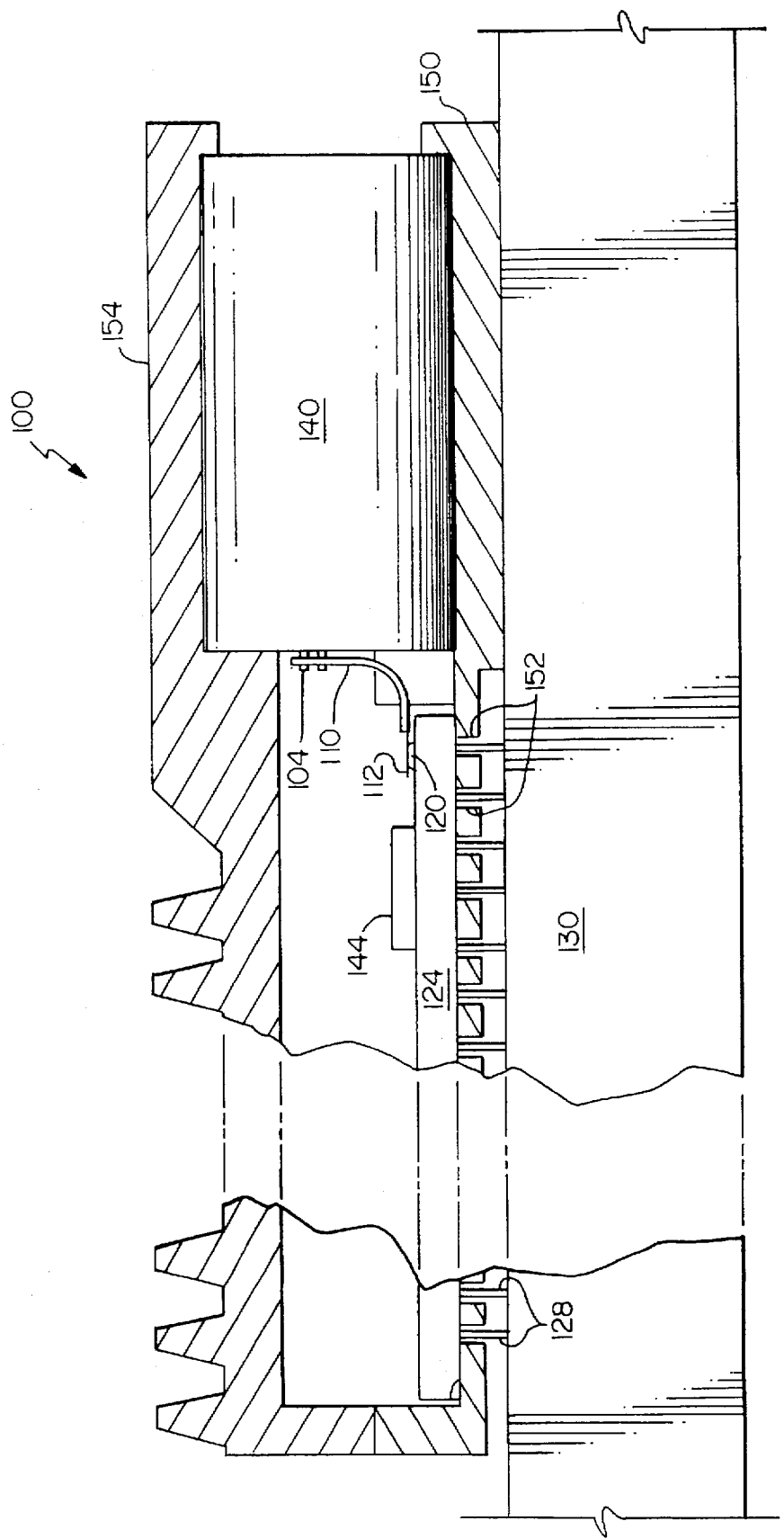
FIG. 2 is a side elevation partial section of the optical module of FIG. 1, showing the connection of the invention between one of the optical sub-assemblies and the ceramic electrical interconnect structure within the housing.

FIG. 2 will be described using the same labels as FIG. 1 for the same components. FIG. 2 is a partial section view of selected parts of optical module 100 of this invention mounted on a section of printed circuit board 130. Optical sub-assembly 140 and ceramic interconnect structure 124 with electronic circuit 144 are mounted between upper cover part 154 and lower part 150. Pins 104 extend axially from optical sub-assembly 140 and through passages at one end of flexible ribbon cable 110. The leads are wave soldered to lands (not shown) on the ribbon cable proximate to the passages. Extending from the lands, electrical conductors within dielectric layers of cable 110 extend from the lands to the distal end of the cable where they are exposed as leads 112 and laser soldered to interconnection pads 120 which are electrically connected to electronic circuit 144 for passing electrical signals between sub-assembly 140 and electronic circuit 144. Pins 128 pass through apertures 152 in the bottom plate of the lower part 150 to connect into the electrical circuit of printed circuit board 130.

The electronic circuits are connected to the ceramic interconnect structure prior to connection to the optical sub-assemblies, therefore flux can not be used in the soldering operation because solvents such as water can not be used to clean the flux off from the substrate.

Figure 3:
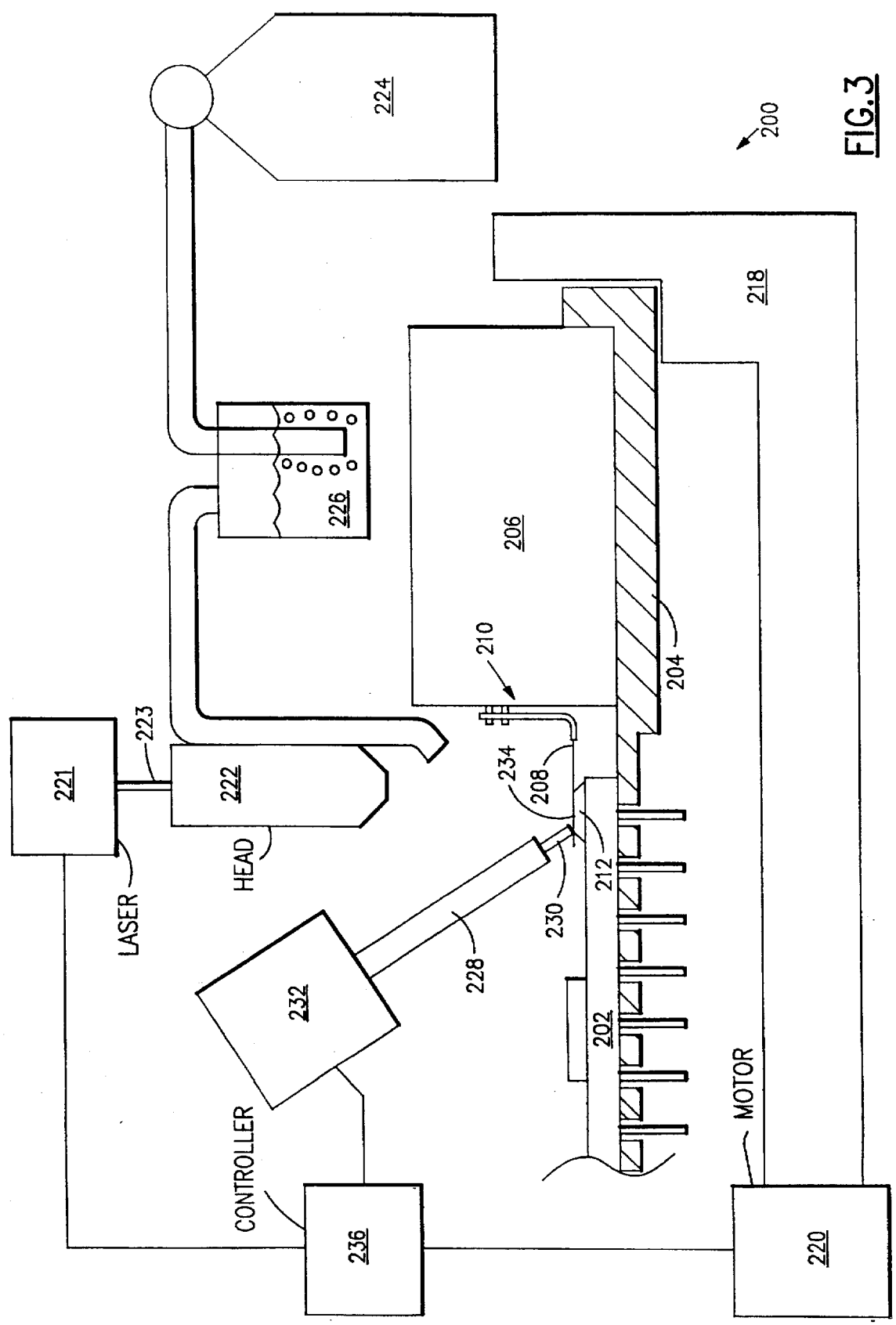
FIG. 3 is a schematic elevation view of the optical module in a machine of the invention for fluxless laser soldering.

FIG. 3 illustrates laser soldering machine 200 of the invention. Ceramic interconnect structure 202 is preferably bonded in the lower section 204 of the two-part aluminum housing. Optical sub-assembly 206 is also positioned in the lower section with leads 208 of flex cable 210 positioned across interconnection pad 212. Lower section 204 of the housing is automatically loaded in stage/conveyor 218 of laser soldering machine 200 and is positioned preferably by a motor 220 relative to laser apparatus 222 for automated laser soldering of lead 208 onto pad 212. Inert gas, preferably nitrogen, from source 224 is mixed with formic acid 226 preferably by bubbling the nitrogen through a reservoir of the acid to produce a mixture of inert gas and formic acid. The gas mixture is delivered to surround lead 208 and pad 212 with an atmosphere or cloud of inert gas mixed with formic acid for fluxless soldering. Probe 228, with surface 230 at the tip composed of a material which is not wettable by solder and is preferably molybdenum, is extended by robot 232 to press against lead 208 to provide good contact between lead 208 and pad 212. The robot may include a spring (not shown) to provide a preset spring load against the lead when the probe is extended. A beam (not shown) is directed by laser unit 221, into optic cable 223, and through head 222 onto lead 208 at 234 which is adjacent to tip 230 of probe 228. The beam heats the lead and the heat is conducted to the surface of pad 212 in contact with the lead to heat the contacting pad surface sufficient for soldering the lead to the pad. The heat from the laser beam reaches the probe tip therefore the tip is preferably constructed of a high temperature material such as molybdenum to provide long service life. Laser 222, motor 220 and robot 232 are connected to controller 236 which automatically directs the laser reflow soldering process.

Preferably the laser unit is a Nd:YAG, CW, 60W laser as provided by MBB of Germany. The controller is an IBM PS/2. The robot includes an IBM System 7576 with a 7576 manipulator, 7532 industrial computer and a 7572 servo power module, the laser head includes optics and an optic fiber connected to the laser unit, a pilot laser, an IR measuring device, and a CCTV camera.

FIGS. 4 illustrates a specific embodiments of the flexible ribbon cable 240 of this invention with 3 conductors. Typically 3 or 4 conductors can be used in optical modules. The ribbon cables are produced by laminating multiple layers of material which include at least one conductive layer and one dielectric layer. Alternatively, the layers may be built up. The thickness of the layers are selected to provide reliability, ease of Construction and minimized material costs. Preferably the conductive layer is less than 0.3 mm thick and is sandwiched between two dielectric layers which are less than 0.1 mm thick.

At one end of each cable apertures 242 have been prepared for soldered connection with pins (not shown) extending from one end of an optical sub-assembly. Proximate to each aperture a window is provided in the dielectric layers to expose a land, 244 attached to a conductor 246 both of an electrical circuit sandwiched between the dielectric layers of the cable. The lands may be for example circular or C-shaped and the electrical circuit of the land and conductor may be any thin layer of conductive solid such as copper or copper coated with chromium for enhanced adhesion with the dielectric layers. A layer of adhesive, preferably epoxy, may be provided to connect the conductive material and the dielectric.

At the other end of the cable, the conductors of the circuit extend out of the dielectric layers for soldered connection at line 248 to conductive pads (not shown) of the electrical circuit of a ceramic interconnect structure.

FIG. 5 illustrates a section 250 of the electrical circuit on the surface of ceramic substrate 252. Circuit section 250 includes a rectangular conductive pad 254 integral with a narrower conductive path 256.

FIG. 6 shows a completed interconnect pad 258 which includes a fiat rectangular pad of approximately 10/90 (Sn/Pb) solder plated to the top of conductive pad 254 to provide a 10/90 (Sn/Pb) solder top surface 260 for reflow soldering to a lead.

Figure 7:
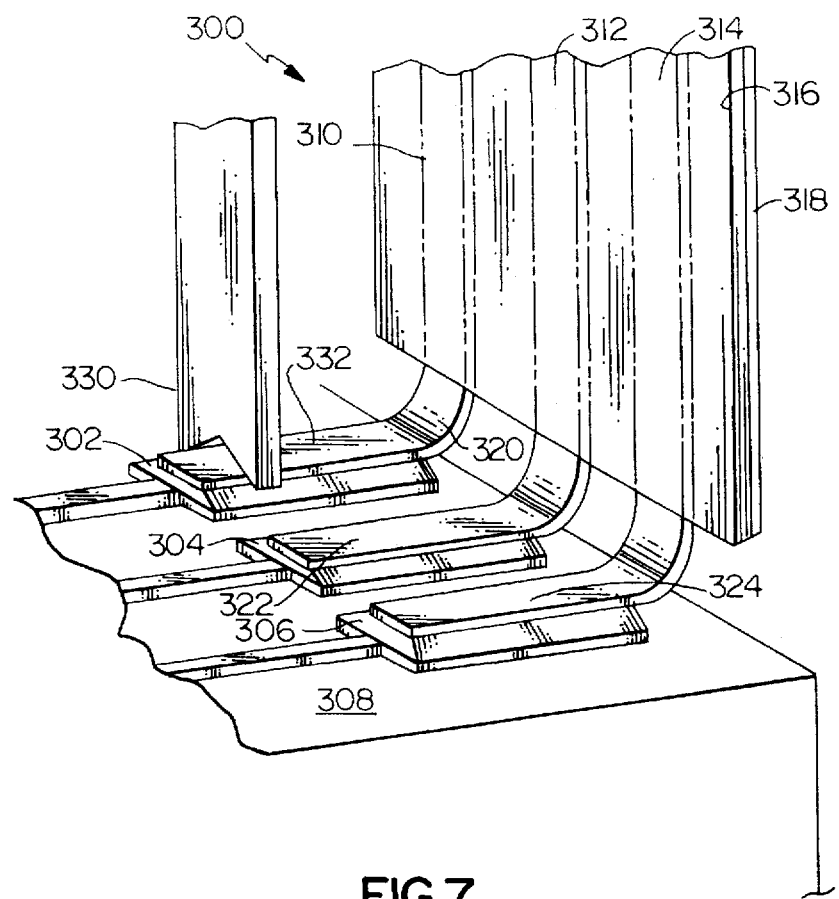
FIG. 7 is an isometric view of three leads extending from an end of a flexible ribbon cable and positioned across the top solder pads of FIG. 5 and illustrating a molybdenum surfaced tip of a probe of the invention holding a lead against a solder pad for laser soldering.

In FIG. 7 flexible ribbon cable 300 is positioned for attachment to three interconnection pads 302, 304 and 306 on the surface of ceramic substrate 308. Cable 302 includes three rectangular conductive paths 310, 312 and 314 generally enclosed between flexible dielectric layers 316 and 318. The conductive paths 310, 312 and 314 extend out of dielectric layers at the lower end of the ribbon cable as leads 320,322, 324 respectively. Preferably, the leads are pre-tinned, i.e. covered with a solder wettable/anti-oxidizing coating such as tin or preferably with eutectic 63/37 (Sn/Pb) solder. Molybdenum coated, probe tip 330 presses against lead 320 to provide high quality thermal and mechanical contact between lead 320 and the 10/90 (Sn/Pb) solder top surface of interconnection pad 302 for soldered connection. The beam of a Nd-YAG laser is directed onto the lead at 332 which is adjacent to the end of probe tip 330 to heat lead 320 by incident radiation and to heat the top surface of pad 302 by conduction for reflow soldering the lead to the pad.

Figure 8:
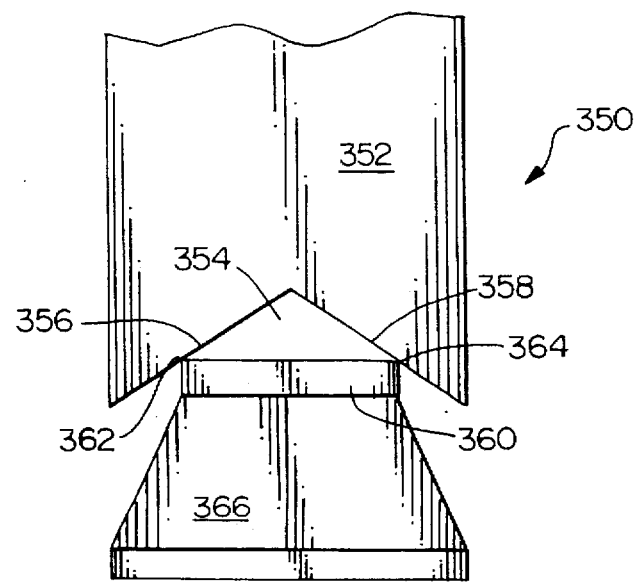
FIG. 8 is an elevational view of the probe tip of the invention.

In FIG. 8, tip 350 of probe 352 has notch 354 with internal sides 356 and 358 angled for contacting lead 360 only at edge corners 362 and 364 for minimizing the heat flow flora the lead into the probe. This minimizes damage to the probe tip and allows more heat to flow into solder pad 366 for high temperature reflow soldering.

While the currently preferred embodiment and alternate embodiments of this invention have been illustrated and described, various changes and modifications may be made therein within the scope of this invention which is defined by the following claims.

We claim:

1. A process for reflow soldering, comprising the steps of:
   producing an electrical circuit assembly with a substrate and including a conductive pad for soldered connection on the surface of the substrate;
   producing a solder pad of Pb and 3–20% Sn solder connected to a surface of the conductive pad;
   positioning the circuit assembly at a laser soldering machine;
   positioning a conductive lead across a surface of the solder pad;
   extending a probe provided with a non-solder wettable surface having a tip configured to press against the lead only at edge corners thereof at a position adjacent to the laser beam; and
   directing a laser beam onto the lead for heating the underlaying solder pad at the lead sufficient for soldering the lead onto the solder pad.

2. The process of claim 1 further including the step of, covering the lead with a solder wettable coating prior to soldering the lead onto the solder pad.

3. The process of claim 1 further including the step of, providing an atmosphere of inert gas mixed with formic acid for fluxless soldering of the lead to the solder pad.

4. The process of claim 3 in which the step of providing the atmosphere includes the step of,
   bubbling the inert gas through formic acid to mix the formic acid into the inert gas.

5. The process of claim 1 further comprising,
   providing a thin copper film of approximately rectangular cross section and less than 0.3mm thick for the lead.

6. The process of claim 1 in which the substrate includes a ceramic material.

7. The process of claim 6 in which, the substrate is essentially ceramic and the conductive pad includes a copper layer plated with about 4 mils of solder.

8. The process of claim 1 further comprising the step of coating a portion of the conductive lead which does not overlay the solder pad with a dielectric layer at least 0.1 mm thick.

9. The process of claim 1 in which the laser beam is produced by a continuous wave Nd-YAG laser.

10. The process of claim 1 in which the material provided for the probe tip surface is Molybdenum.

11. The invention as defined in claim 1 wherein said configuration of the tip includes a notch.

12. A process for reflow soldering, comprising the steps of:
   producing an electrical circuit assembly including a row of conductive pads for soldered connection on the surface of a substrate;
   producing integral pads of Pb and 3–20% Sn solder connected on the surface of the conductive pads;
   positioning leads extending from one end of a flexible ribbon cable across the surface of the row of solder pads;
   positioning the substrate in a laser soldering machine;
   extending a probe provided with a non-solder wettable surface having a tip configured to press against the lead only at edge corners thereof at a position adjacent to the laser beam; and
   directing a laser beam onto each lead for heating the underlying solder pads at the leads sufficient for soldering the leads onto the solder pads.

13. The process of claim 12 in which, the solder pads are provided in the row spaced less than 2 mm apart.

14. The invention as defined in claim 12 wherein said configuration of the tip includes a notch.

* * * * *